(12) United States Patent
Worley

(10) Patent No.: US 7,675,127 B1
(45) Date of Patent: Mar. 9, 2010

(54) MOSFET HAVING INCREASED SNAP-BACK CONDUCTION UNIFORMITY

(75) Inventor: Eugene R. Worley, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 11/107,206

(22) Filed: Apr. 15, 2005

Related U.S. Application Data

(60) Provisional application No. 60/582,424, filed on Jun. 24, 2004.

(51) Int. Cl.
*H01L 29/78* (2006.01)

(52) U.S. Cl. .............................. 257/409; 257/E29.012

(58) Field of Classification Search ................ 257/408, 257/409, 296, 327, 368, E29.012
See application file for complete search history.

(56) References Cited

U.S. PATENT DOCUMENTS

| | | | | |
|---|---|---|---|---|
| 5,838,050 A | * | 11/1998 | Ker et al. ..................... | 257/401 |
| 6,747,294 B1 | * | 6/2004 | Gupta et al. ................ | 257/127 |
| 6,979,869 B2 | * | 12/2005 | Chen et al. .................. | 257/356 |
| 2004/0051146 A1 | * | 3/2004 | Ker et al. ..................... | 257/356 |
| 2004/0164354 A1 | * | 8/2004 | Mergens et al. ............. | 257/355 |

* cited by examiner

*Primary Examiner*—Lynne A. Gurley
*Assistant Examiner*—Colleen A Matthews
(74) *Attorney, Agent, or Firm*—Farjami & Farjami LLP

(57) ABSTRACT

According to an exemplary embodiment, a semiconductor structure includes an NFET situated over a substrate. The semiconductor structure further includes a P+ substrate tie ring surrounded the NFET. The P+ substrate tie ring includes a salicide layer situated on a P+ diffusion region. The semiconductor structure further includes an N well ring situated between the NFET and the P+ substrate tie ring, where the N well ring increases snap-back conduction uniformity in the NFET. The semiconductor structure further includes an N+ active ring situated between the NFET and the P+ substrate tie ring, where the N+ active ring surrounds the NFET and connects the P+ substrate tie ring to the N well ring. The N+ active ring includes a salicide layer situated on an N+ diffusion region, where the salicide layer of the N+ active ring connects the N well ring to the P+ substrate tie ring.

13 Claims, 5 Drawing Sheets

MOSFET HAVING INCREASED SNAP-BACK CONDUCTION UNIFORMITY

The present application claims the benefit of a provisional patent application entitled "Improved MOSFET Snap-Back Conduction Uniformity" invented by Eugene R. Worley, Ser. No. 60/582,424 filed on Jun. 24, 2004. The disclosure in that provisional application is hereby incorporated fully by reference into the present application.

BACKGROUND OF THE INVENTION

1. Field of the Invention

The present invention is generally in the field of integrated circuits. More specifically, the invention is in the field of ESD protection for integrated circuits.

2. Related Art

MOSFET snap-back devices, such as snap-back NFETs, have been used as electrostatic discharge (ESD) clamp devices as well as to protect I/O driver transistors from ESD damage. Snap-back in a MOSFET involves the triggering of a parasitic lateral bipolar transistor into a conducting mode, which is sustained by impact ionization current generated from the collector current. By way of background, the source, body, and drain of the MOSFET form, respectively, the emitter, base, and collector of a parasitic lateral bipolar transistor. Unfortunately, because of the negative resistance characteristic of snap-back, conduction can be non-uniform such that only a portion of the transistor conducts at the point where a leakage failure occurs.

A number of conventional methods have been incorporated into the MOSFET to improve snap-back conduction uniformity. In one conventional method, a drain resistor is used to extend the voltage of a conducting region's failure point. The higher failure voltage afforded by the inclusion of the drain resistor allows the drain voltage to reach the conduction trigger voltage of other, "off" regions before failure of the region that is already in the conducting or "on" state. Unfortunately, the resistor adds considerable area and drain capacitance to the structure layout. Also, since the incorporation of salicide into processes, a salicide block mask is required to make the diffusion resistor, which requires an additional processing step.

Thus, there is a need in the art for a MOSFET device having improved snap-back conduction uniformity for more effective ESD protection.

SUMMARY OF THE INVENTION

The present invention is directed to MOSFET having increased snap-back conduction uniformity. The present invention addresses and resolves the need in the art for a MOSFET device having improved snap-back conduction uniformity for more effective ESD protection.

According to an exemplary embodiment, a semiconductor structure includes an NFET situated over a substrate. The semiconductor structure further includes a P+ substrate tie ring surrounded the NFET. The P+ substrate tie ring includes a salicide layer situated on a P+ diffusion region. The semiconductor structure further includes an N well ring situated between the NFET and the P+ substrate tie ring, where the N well ring increases snap-back conduction uniformity in the NFET. The N well ring can cause an increase in substrate resistance between the P+ substrate tie ring and at least one channel region of the NFET.

According to this exemplary embodiment, the semiconductor structure further includes an N+ active ring situated between the NFET and the P+ substrate tie ring, where the N+ active ring surrounds the NFET and connects the P+ substrate tie ring to the N well ring. The N+ active ring includes a salicide layer situated on an N+ diffusion region, where the salicide layer of the N+ active ring connects the N well ring to the P+ substrate tie ring. Other features and advantages of the present invention will become more readily apparent to those of ordinary skill in the art after reviewing the following detailed description and accompanying drawings.

DETAILED DESCRIPTION OF THE INVENTION

The present invention is directed to MOSFET having increased snap-back conduction uniformity. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves increasing and thereby improving snap-back conduction uniformity in a MOSFET. Although an NFET is utilized to illustrate the invention, the present invention can be also be applied to other types of MOSFETs.

One approach to improving snap-back conduction uniformity in a MOSFET is to raise the gate voltage of the MOSFET in response to an ESD transient. The increased gate voltage causes conduction current to flow in the MOSFET channel, which lowers the snap-back trigger voltage by providing seed current for impact ionization. In a typical snap-back MOSFET configuration, the gate is grounded and snap-back is initiated by drain avalanche breakdown. In contrast, in the approach where the gate voltage is elevated, MOSFET channel current is used to initiate snap-back well ahead of avalanche breakdown. Thus, by elevating gate voltage, the trigger voltage is lowered while the holding voltage remains approximately the same. As a result, the negative resistance region or the snap-back swing is reduced, thereby facilitating uniform conduction in the MOSFET.

Figure 1:
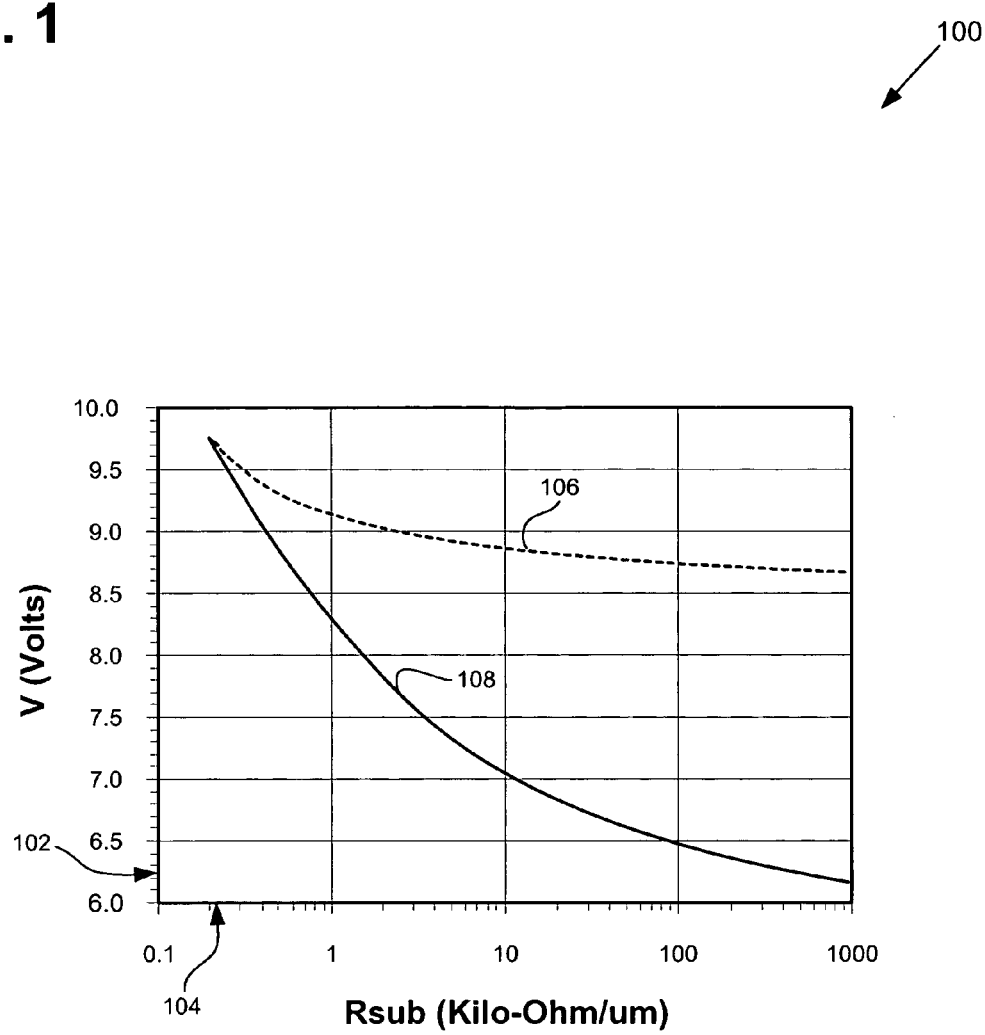
FIG. 1 is a graph showing trigger and holding voltage curves of an exemplary NFET.

FIG. 1 shows exemplary graph 100 including exemplary trigger voltage and holding voltage curves of an exemplary snap-back NFET with the gate grounded. Graph 100 includes voltage axis 102, Rsub resistance axis 104, trigger voltage curve 106, and holding voltage curve 108. In graph 100, voltage axis 102 corresponds to an exemplary trigger and holding voltage range of an exemplary snap-back NFET and Rsub resistance axis 104 corresponds to an exemplary channel to substrate tie resistance range for the exemplary snap-back NFET. In graph 100, trigger voltage curve 106 corresponds to an exemplary trigger voltage range of the exemplary snap-back NFET and holding voltage curve 108 corresponds to an exemplary holding voltage range of the exemplary snap-back NFET.

In the example shown in graph 100, trigger voltage curve 106 shows a decrease in trigger voltage of the exemplary snap-back NFET with increasing channel to substrate tie resistance and holding voltage curve 108 shows a decrease in holding voltage of the exemplary snap-back NFET with increasing channel to substrate tie resistance. As discussed above, uniform conduction in a MOSFET can be facilitated by decreasing the snap-back trigger voltage. Thus, increasing the substrate resistance between the substrate tie and the NFET channel can improve NFET conduction uniformity in the snap-back mode.

Figure 2:
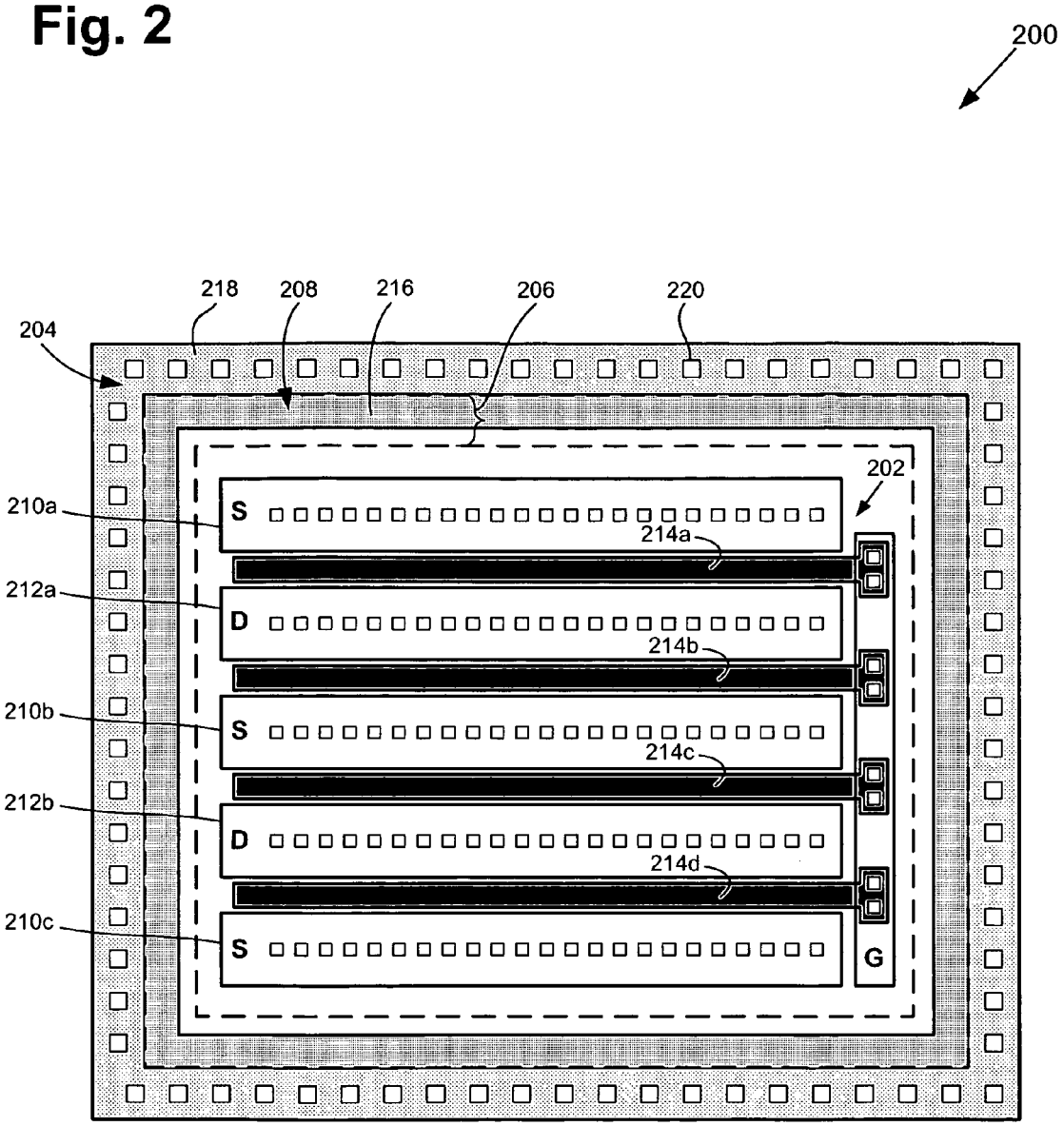
FIG. 2 illustrates a top view of an exemplary structure including an exemplary snap-back NFET in accordance with one embodiment of the present invention.

FIG. 2 shows a top view of a portion of a semiconductor die including an exemplary snap-back NFET surrounded by a P+ substrate tie ring, an N well ring, and an N+ active ring in accordance with one embodiment of the present invention. Certain details and features have been left out of FIG. 2, which are apparent to a person of ordinary skill in the art. As shown in FIG. 2, structure 200 includes NFET 202, P+ substrate tie ring 204, N well ring 206, and N+ active ring 208. NFET 202 further includes a source, which comprises source segments 210a, 210b, and 210c, a drain, which comprises drain segments 212a and 212b, a gate, which comprises gate fingers 214a, 214b, 214c, and 214d, and channel regions, which are situated under respective gate fingers 214a, 214b, 214c, and 214d.

As shown in FIG. 2, N well 206 is situated in a substrate (not shown in FIG. 2) and surrounds NFET 202, which is a snap-back NFET. Also shown in FIG. 2, N+ active ring 208 is situated over N well 206 and surrounds NFET 202. N+ active ring 208 comprises an N+ diffusion region (not shown in FIG. 2), which is situated in N well 206, and salicide layer 216, which is situated on the surface of the N+ diffusion region. Further shown in FIG. 2, P+ substrate tie ring 204 surrounds N well 206 and N+ active ring 208 and comprises a P+ diffusion region (not shown in FIG. 2), which is situated in the substrate (not shown in FIG. 2), salicide layer 218, which is situated on the surface of the P+ diffusion region and also situated in contact with salicide layer 216, and contacts 220. In the embodiment of the present invention in FIG. 2, the N+ diffusion region of N+ active ring 208 is utilized to connect N well 206 to the P+ diffusion region of P+ substrate tie ring 204 via salicide layers 216 and 218. In one embodiment, N+ active ring 208 is not utilized, which causes N well 206 to float.

By way of background, substrate resistance includes two components: a bulk region component and a surface region component. As a result of field and/or P well implants in the substrate, the surface region component is substantially more conductive than the bulk region component. Thus, by providing N well 206 between P+ substrate tie ring 204 and NFET 202, the surface region component of the substrate resistance between P+ substrate tie ring 204 and an area close to NFET 202 is effectively removed, which leaves only the bulk region component. As a result, the substrate resistance between P+ substrate tie ring 204 and NFET 202 channel regions, which are situated under respective gate fingers 214a, 214b, 214c, and 214d, is increased. Thus, by providing N well 206 between P+ substrate tie ring 204 and NFET 202 to increase the substrate resistance between P+ substrate tie ring 204 and NFET 202 channel regions, the embodiment of the present invention in FIG. 2 advantageously achieves improved (i.e. increased) NFET snap-back conduction uniformity.

Figure 3:
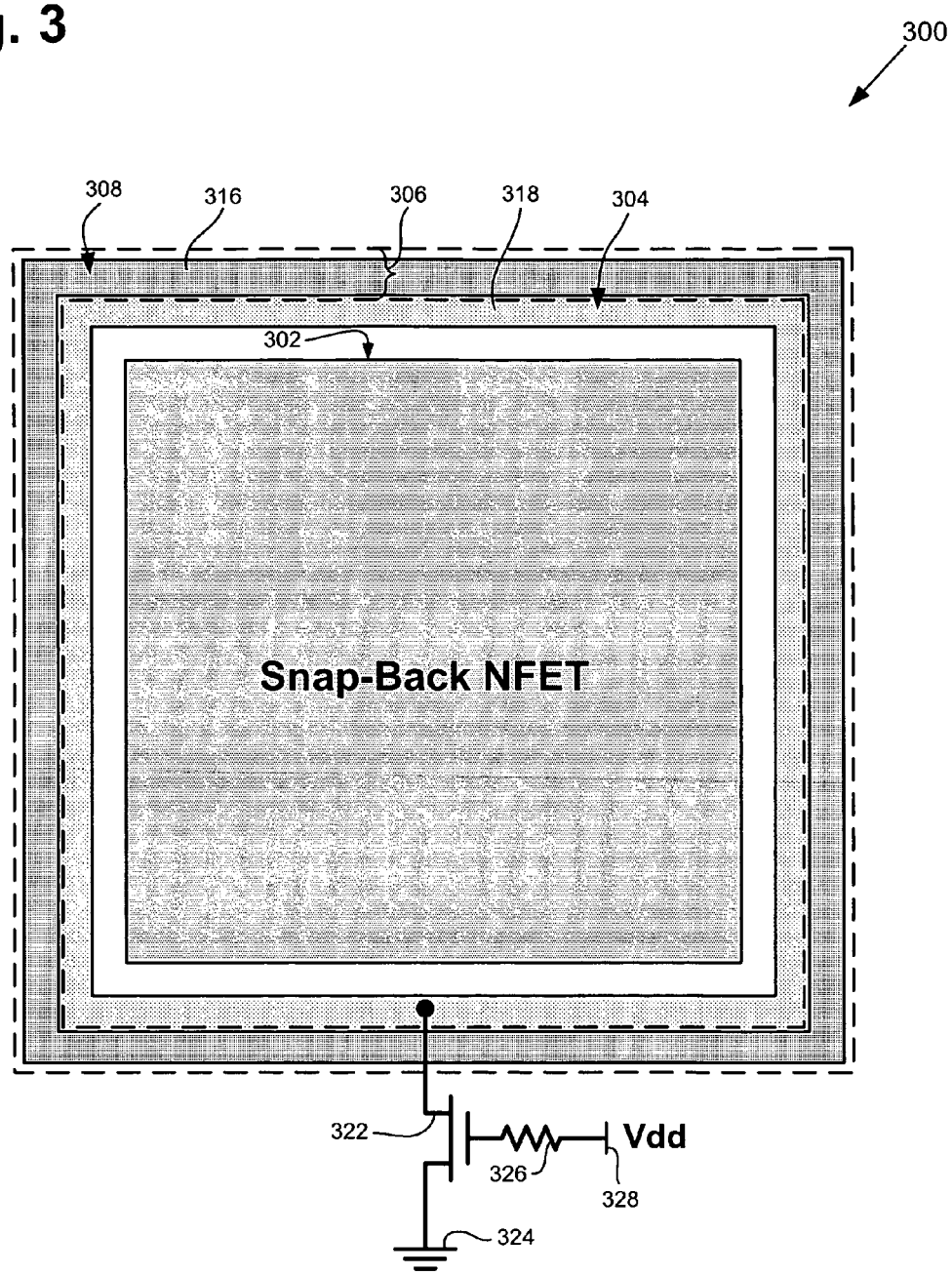
FIG. 3 illustrates a top view of an exemplary structure including an exemplary snap-back NFET in accordance with one embodiment of the present invention.

FIG. 3 shows a top view of a portion of a semiconductor die including an exemplary snap-back NFET surrounded by a P+ substrate tie ring, which is connected to an NFET, an N well ring, and an N+ active ring in accordance with one embodiment of the present invention. Certain details and features have been left out of FIG. 2, which are apparent to a person of ordinary skill in the art. In FIG. 3, NFET 302, P+ substrate tie ring 304, N well 306, N+ active ring 308, salicide layer 316, and salicide layer 318 in structure 300 correspond, respectively, to NFET 202, P+ substrate tie ring 204, N well 206, N+ active ring 208, salicide layer 216, and salicide layer 218 in structure 200 in FIG. 2. As shown in FIG. 3, structure 300 includes NFET 302, P+ substrate tie ring 304, N well ring 306, N+ active ring 308, and NFET 322.

Also shown in FIG. 3, P+ substrate tie ring 304 surrounds NFET 302, which is a snap-back NFET, and comprises a P+ diffusion (not shown in FIG. 3), which is situated in a substrate (not shown in FIG. 3), and salicide layer 318, which is situated on the surface of the P+ diffusion region. Further shown in FIG. 3, N well 306 is situated in the substrate (not shown in FIG. 3) and surrounds NFET 302 and P+ substrate tie ring 304. Also shown in FIG. 3, N+ active ring 308 is situated over N well 306 and surrounds NFET 302 and P+ substrate tie ring 304. N+ active ring 308 comprises an N+ diffusion region (not shown in FIG. 3), which is situated in N well 306, and salicide layer 316, which is situated on the surface of the N+ diffusion region. Further shown in FIG. 3, a drain terminal of NFET 322 is coupled to P+ substrate tie ring 304, a source terminal of NFET 322 is coupled to ground 324, and a gate terminal of NFET 322 is coupled to a first terminal of resistor 326. NFET 322 is configured to couple P+ substrate tie ring 304 to ground 324 when NFET 322 is turned on. Also shown in FIG. 3, a second terminal of resistor 326 is coupled to voltage source 328 (i.e. Vdd).

In the embodiment of the present invention in FIG. 3, the N+ diffusion region of N+ active ring 308 is utilized to connect N well 306 to the P+ diffusion region of P+ substrate tie ring 304 via salicide layers 316 and 318. In one embodiment, N+ active ring 308 is not utilized, which causes N well 306 to float. Thus, in the embodiment of the present invention in FIG. 3, P+ substrate tie ring 304 is situated inside N well ring 306. In contrast, P+ substrate tie ring 204 is situated outside N well ring 206 in the embodiment of the present invention in FIG. 2. In one embodiment, a second P+ substrate tie ring can be situated outside of N well ring 306 and can be hard tied to ground. In such embodiment, N+ active ring 308 does not extend into either the exterior P+ substrate tie ring or the interior P+ substrate tie ring (i.e. P+ substrate tie ring 304) to prevent a short from occurring between the two P+ substrate tie rings. Also, N well ring 306 can be isolated from the two P+ substrate tie rings and tied to Vdd.

During normal operation, the gate terminal of NFET 322 is held at Vdd, which turns on NFET 322. Thus, in normal operation, NFET 322, which has an "on" resistance on the order of 10's of Ohms, couples P+ substrate tie ring 304 to ground 324. However, during an ESD transient, the RC time constant determined by the gate capacitance and resistor 326 is substantially greater than the ESD transient rise time. As a result, the gate terminal of NFET 322 is momentarily at ground potential during the ESD transient such that NFET 322 is turned off. Since NFET 322 is turned off during the ESD transient, the resistance between the snap-back NFET (i.e. NFET 302) and substrate ties to ground that situated are external to P+ substrate tie ring 204 is high, thereby providing increased snap-back conduction uniformity in NFET 302.

Figure 4:
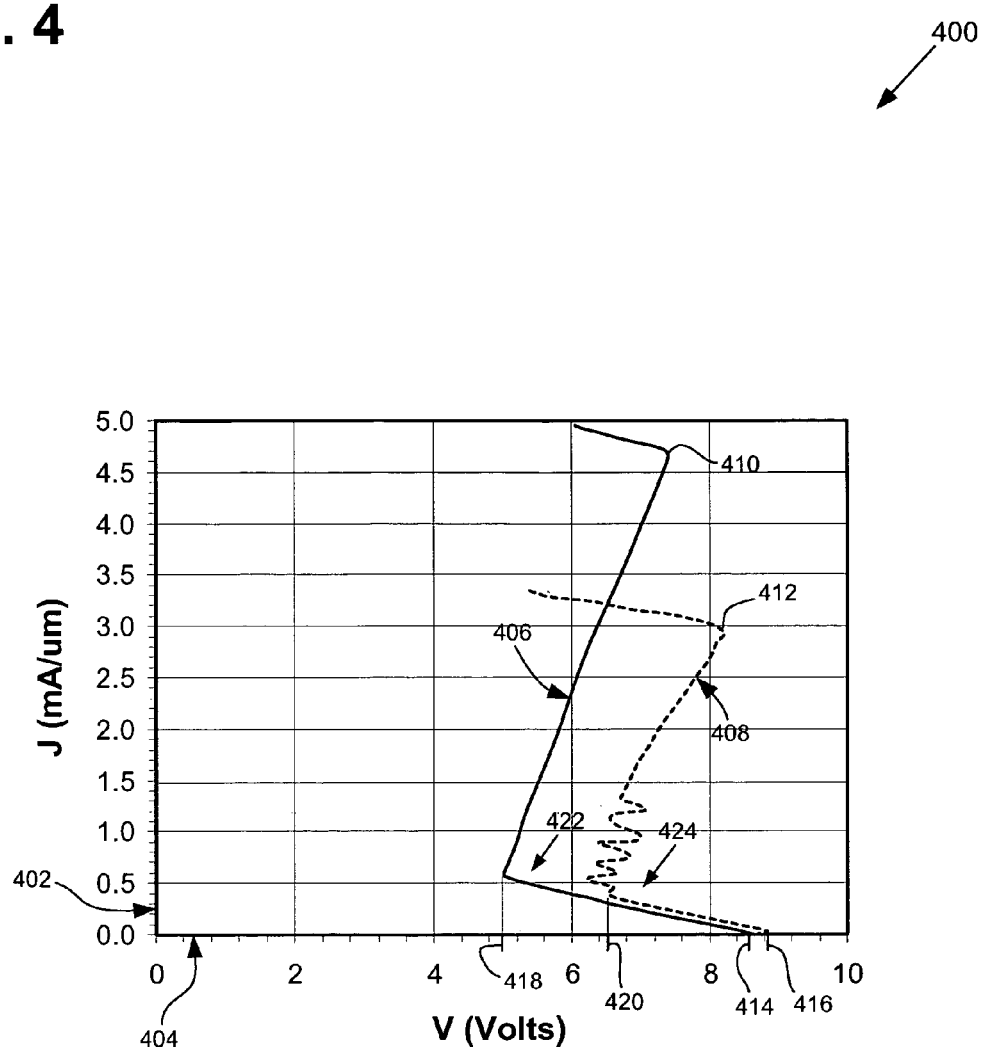
FIG. 4 is a graph showing an exemplary J-V curve for an exemplary snap-back NFET in accordance with one embodiment of the present invention.

FIG. 4 shows exemplary graph 400 including an exemplary J-V curve of an exemplary conventional snap-back NFET and an exemplary J-V curve of an exemplary snap-back NFET in accordance with one embodiment of the present invention. Graph 400 includes linear current density (J) axis 402, voltage axis 404, J-V curve 406, and J-V curve 408. In graph 400, current density axis 402 corresponds to an exemplary range of current density per micron of NFET channel width and voltage axis 404 corresponds to an exemplary Transmission Line Pulser (TLP) voltage range. In graph 400, J-V curve 406 corresponds to NFET 202 in FIG. 2, which utilizes P+ substrate tie ring 204, N well ring 206, and N+ active ring 208 in FIG. 2 and has a grounded gate. J-V curve 406 also corresponds to NFET 202 in FIG. 2 having a contact to poly spacing of 0.5 micron, a channel length of 0.4 micron, and a finger pitch in the length direction of 1.58 micron. In graph 400, J-V curve 408 corresponds to an exemplary conventional NFET that is laid out using conventional foundry-ballasting rules and having a grounded gate, a channel length of 0.4 microns, and a finger pitch in the length direction of 3.50 micron.

In the example shown in graph 400, J-V curve 406 shows current failure point 410, which occurs at approximately 4.70 mA/um of width, which corresponds to a failure current density per unit area of approximately 2.97 mA/um$^2$, for NFET 202 in FIG. 2. In contrast, J-V curve 408 shows current failure point 412, which occurs at approximately 2.95 mA/um, which corresponds to a failure current density per unit area of approximately 0.84 mA/um$^2$, for a conventional NFET with a foundry-ballasted layout. Thus, NFET 202 in FIG. 2 advantageously achieves a failure current density per unit area that is approximately 3.5 times greater than the failure current density per unit area of the conventional foundry NFET. Also, NFET 202 in FIG. 2 advantageously achieves a drain capacitance that is less than one fourth of the drain capacitance of the conventional foundry NFET. Furthermore, NFET 202 in FIG. 2 advantageously consumes approximately 55 percent less area than a conventional foundry NFET for a given MOSFET width.

In the example shown in graph 400, trigger voltage 414 in J-V curve 406 is slightly lower than trigger voltage 416 in J-V curve 408 and holding voltage 418 in J-V curve 406 is substantially lower than holding voltage 420 in J-V curve 408. Also, the conduction clamping voltage in snap-back region 422 of J-V curve 406 is approximately 1.6 volts lower for a given current compared to the conduction clamping voltage in snap-back region 424 of J-V curve 408. Thus, NFET 202 in the embodiment of the present invention in FIG. 2 advantageously achieves more effective ESD protection than a conventional foundry NFET by clamping to lower voltages.

Figure 5:
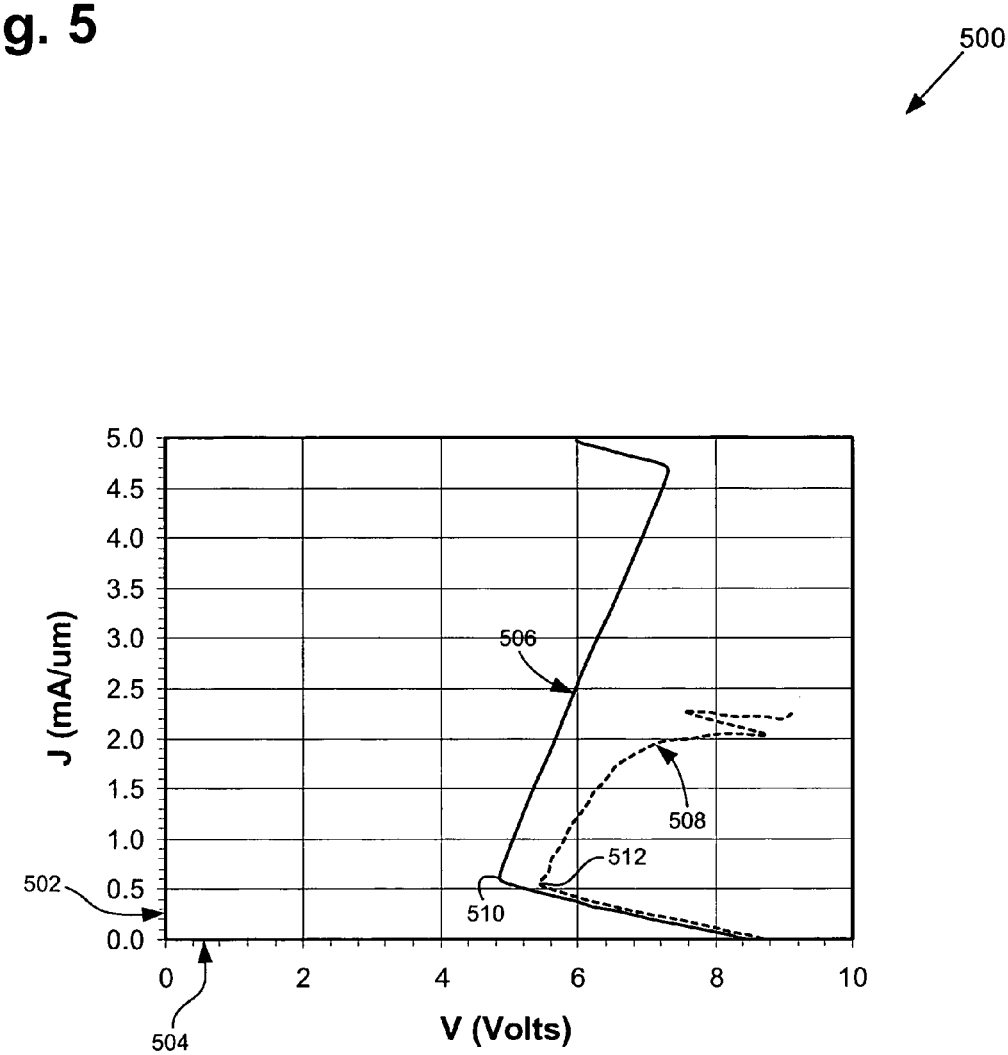
FIG. 5 is a graph showing an exemplary J-V curve for an exemplary snap-back NFET in accordance with one embodiment of the present invention.

FIG. 5 shows exemplary graph 500 including an exemplary J-V curve of an exemplary snap-back NFET with an N well ring and the exemplary snap-back NFET without the N well ring in accordance with one embodiment of the present invention. Graph 500 includes current density axis 502, voltage axis 504, J-V curve 506, and J-V curve 508. In graph 500, current density axis 502 corresponds to an exemplary TLP current density range and voltage axis 504 corresponds to an exemplary TLP voltage range. In graph 500, J-V curve 506 corresponds to NFET 202 in FIG. 2 with N well ring 206 and J-V curve 508 corresponds to NFET 202 without N well ring 206.

In the example shown in graph 500, a linear failure current density of approximately 2.0 mA/µm amperes is shown at point 510 of I-V curve 506, while a linear failure current density of approximately 4.70 mA/µm is shown at point 512 of I-V curve 508. The lower linear failure current density of NFET 202 without N well ring 206 suggests a smaller triggered or conducting region of NFET 202 without N well ring 206. Thus, N well ring 206 provides increased NFET conduction current uniformity in the snap-back mode.

Thus, in the embodiments of the present invention in FIGS. 2 and 3, by providing an N well ring, a P+ substrate tie ring, and an N+ active ring, the present invention advantageously achieves increased NFET conduction uniformity in the snap-back mode. Also, the present invention advantageously provides a substantial increase in conduction current density at failure and a substantial decrease in drain capacitance per unit of conduction current at failure compared to a conventional foundry-ballasted NFET. Furthermore, the present invention achieves a lower conduction-offset voltage compared to the conventional foundry-ballasted NFET, which advantageously provides more effective ESD protection.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, MOSFET having increased snap-back conduction uniformity has been described.

The invention claimed is:

1. A semiconductor structure comprising:
   an NFET situated over a substrate;
   a P+ substrate tie ring surrounding said NFET;
   an N well ring situated between said NFET and said P+ substrate tie ring, such that said N well ring is situated adjacent to said NFET;
   an N+ active ring situated over said N well ring, said N+ active ring is in direct contact with said P+ substrate tie ring and connects said P+ substrate tie ring to said N well ring;
   wherein said N+ active ring connects said P+ substrate tie ring to said N well ring, and wherein said N well ring causes an increase in substrate resistance between said P+ substrate tie ring and at least one channel region of said NFET so as to increase snap-back conduction uniformity in said NFET.

2. The semiconductor structure of claim 1 wherein said N+ active ring comprises a salicide layer situated on an N+ diffusion region.

3. The semiconductor structure of claim 1 wherein said P+ substrate tie ring comprises a salicide layer situated on a P+ diffusion region.

4. The semiconductor structure of claim 2 wherein said salicide layer of said N+ active ring connects said N well ring to said P+ substrate tie ring.

5. A semiconductor structure comprising:
   a first NFET situated over a substrate;
   an N well ring surrounding said first NFET;
   a P+ substrate tie ring situated between said N well ring and said first NFET, said P+ substrate ring surrounding said first NFET, said P+ substrate tie ring being in contact with said N well ring;

an N+ active ring situated over said N well ring, wherein said N+ active ring is in direct contact with said P+ substrate tie ring and connects said P+ substrate tie ring to said N well ring;

wherein said N well ring increases snap-back conduction uniformity in said first NFET, and wherein said P+ substrate tie ring is switchably coupled to a ground in a normal operating mode and switchably uncoupled from said ground during an occurrence of an ESD transient.

6. The semiconductor structure of claim 5 wherein said N+ active ring comprises salicide layer situated on an N+ diffusion region.

7. The semiconductor structure of claim 5 wherein said P+ substrate tie ring comprises a salicide layer situated on a P+ diffusion region.

8. The semiconductor structure of claim 5 further comprising a second NFET having a drain terminal, a source terminal, and a gate terminal, wherein said drain terminal is coupled to said P+ substrate tie ring, said source terminal is coupled to said ground, and said gate terminal is coupled to Vdd.

9. The semiconductor structure of claim 8 wherein said second NFET is configured to disconnect said P+ substrate tie ring from said ground during said occurrence of said ESD transient.

10. The semiconductor structure of claim 8 wherein said gate terminal is coupled to said Vdd by a resistor, wherein a time constant determined by said resistor and a gate capacitance of said second NFET is substantially greater than a rise time of said ESD transient.

11. A semiconductor structure comprising:
a first NFET situated over a substrate, said first NFET being a snap-back NFET;
an N well ring surrounding said first NFET;
a P+ substrate tie ring situated between said N well ring and said first NFET, said P+ substrate tie ring surrounding said first NFET, said P+ substrate tie ring being in contact with said N well ring;
an N+ active ring situated over said N well ring, wherein said N+ active ring is in direct contact with said P+ substrate tie ring and connects said N well ring to said P+ substrate tie ring;
a second NFET configured to couple said P+ substrate tie ring to a ground in a normal operating mode and to disconnect said P+ substrate tie ring from said ground during an occurrence of an ESD transient.

12. The semiconductor structure of claim 11 wherein said second NFET has a drain terminal, a source terminal, and a gate terminal, wherein said drain terminal is coupled to said P+ substrate tie ring, said source terminal is coupled to said ground, and said gate terminal is coupled to Vdd.

13. The semiconductor structure of claim 12 wherein said gate terminal is coupled to said Vdd by a resistor, wherein a time constant determined by said resistor and a gate capacitance of said second NFET is substantially greater than a rise time of said ESD transient.

* * * * *